United States Patent [19]

Mimoto

[11] Patent Number: 4,651,028

[45] Date of Patent: Mar. 17, 1987

[54] INPUT CIRCUIT OF MOS-TYPE INTEGRATED CIRCUIT ELEMENTS

[75] Inventor: Toshio Mimoto, Nara, Japan

[73] Assignee: Sharp Kabushiki Kaisha, Osaka, Japan

[21] Appl. No.: 721,800

[22] Filed: Apr. 10, 1985

[30] Foreign Application Priority Data

Apr. 20, 1984 [JP] Japan ................................. 59-80909

[51] Int. Cl.[4] ..................... H03K 17/10; H03K 3/356; H03K 19/096
[52] U.S. Cl. ................................. 307/296 A; 307/453; 307/578; 307/279; 307/290
[58] Field of Search ............... 307/448, 450, 482, 578, 307/581, 583, 279, 290, 296 A, 453

[56] References Cited

U.S. PATENT DOCUMENTS

| | | | |
|---|---|---|---|
| 3,959,781 | 5/1976 | Mehta et al. | 307/279 X |
| 4,071,784 | 1/1978 | Maeder et al. | 307/290 X |
| 4,190,897 | 2/1980 | Someshwar | 307/482 X |
| 4,379,974 | 4/1983 | Plachno | 307/279 X |
| 4,431,927 | 2/1984 | Eaton, Jr. et al. | 307/578 X |
| 4,461,963 | 7/1984 | Koomen | 307/279 |
| 4,563,595 | 1/1986 | Bose | 307/279 X |

OTHER PUBLICATIONS

Joynson et al., "Eliminating Threshold Losses in MOS Circuits by Bootstrapping Using Varactor Coupling", IEEE-JSSC, vol. SC-7, No. 3, pp. 217-224; 6/1972.

Primary Examiner—Larry N. Anagnos
Attorney, Agent, or Firm—Flehr, Hohbach, Test, Albritton & Herbert

[57] ABSTRACT

An input circuit of MOS integrated circuit elements for a signal transmitting circuit having a first enhancement-mode MOS field-effect transistor, the gate thereof being connected to a power source and the drain thereof being connected to a first action signal, a second enhancement-mode MOS field-effect transistor, the drain thereof being connected to said power source, and a depletion-mode MOS field-effect transistor, the gate and source thereof being connected to each other, the source of said first enhancement-mode MOS field-effect transistor being connected to the gate of said second enhancement-mode MOS field-effect transistor, the source of said second enhancement-mode MOS field-effect transistor being connected to the drain of said depletion-mode MOS field-effect transistor, the source of the depletion-mode MOS field-effect transistor being connected to the signal transmitting circuit and a boost capacitor being connected between the gate of said second enhancement-mode MOS field-effect transistor and a second action signal to result in a potential at approximately the level of the power source at a node between the second enhancement-mode MOS field-effect transistor and the depletion-mode MOS field-effect transistor.

2 Claims, 3 Drawing Figures

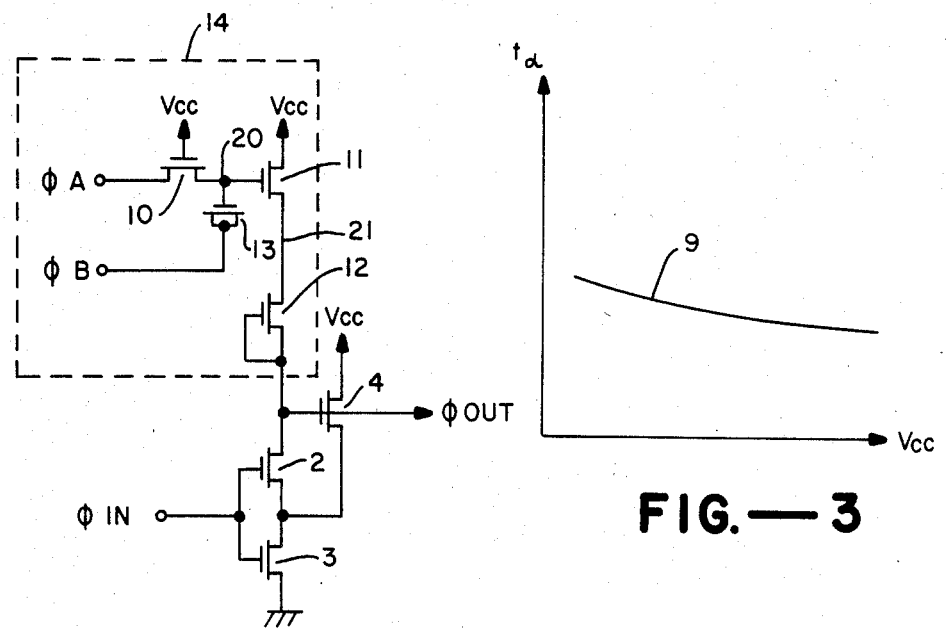
FIG.—1
FIG.—3
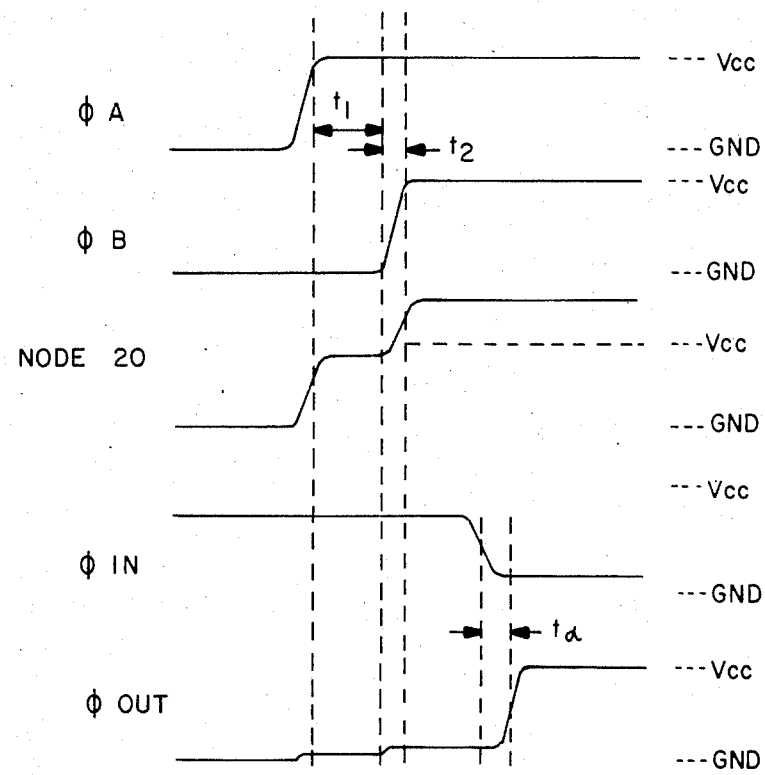
FIG.—2

INPUT CIRCUIT OF MOS-TYPE INTEGRATED CIRCUIT ELEMENTS

This invention relates to an improved input circuit of MOS-type integrated circuit elements and more particularly to such an input circuit having improved delay characteristics.

An object of this invention is to provide an input circuit of MOS-type integrated circuit elements with reduced power consumption and improved delay characteristics.

The above and other objects of this invention are attained by providing an input circuit with MOS-type integrated circuit elements comprising a first enhancement-mode MOS field-effect transistor (hereinafter abbreviated into EMOSFET) to the gate of which a power source is connected and to the drain of which a first action signal is adapted to be applied, a second EMOSFET to the drain of which the power source is connected, and a depletion-mode MOS field-effect transistor (hereinafter abbreviated into DMOSFET) the gate and the source of which are connected, the source of the first EMOSFET and the gate of the second EMOSFET being connected, the source of the second EMOSFET and the drain of the DMOSFET being connected, and a boost capacitor being connected between the gate of the second EMOSFET and a second action signal.

The foregoing objects and the invention will be more clearly understood from the following description which is provided by way of example and not of limitation, wherein:

FIG. 1 is a circuit diagram according to an embodiment of the invention;

FIG. 2 is a signal waveform diagram for explaining its operation; and

FIG. 3 is a diagram showing the delay characteristics of an input circuit.

In FIG. 1, there is shown a circuit diagram according to an embodiment of the present invention, wherein numerals 2, 3, 4, 10 and 11 indicate respectively an EMOSFET and numeral 12 indicates a DMOSFET. The source of the EMOSFET 3 is grounded, the drain of the EMOSFET 3 and the source of the EMOSFET 2 are connected and this joint is connected to the source of the EMOSFET 4. The gates of the EMOSFETs 2 and 3 are joined and connected to an input terminal $\phi_{IN}$. The drain of the EMOSFET 2 and the source of the DMOSFET 12 are connected and this joint is connected to the gate of the EMOSFET 4, the drain of which is connected to a power source $V_{CC}$, to form an output terminal $\phi_{OUT}$. The source and the gate of the DMOSFET 12 are connected, its drain is connected to the source of the EMOSFET 11 and the drain of the EMOSFET 11 is connected to the power source $V_{CC}$. The drain of the EMOSFET 10 is connected to a first action signal terminal $\phi_A$, its gate is connected to the power source $V_{CC}$ and its source is connected to the gate of the EMOSFET 11, a MOS capacitor 13 for boosting being connected between this joint (node 20) and a second action signal terminal $\phi_B$. The EMOSFETs 10 and 11, the DMOSFET 12 and the boost MOS capacitor 13 form the load 14 for the input circuit.

The circuit described above is further so designed that the driving capability of the EMOSFET 11 (or its current amplification factor) is sufficiently larger than that of the DMOSFET 12. This can be accomplished, for example, by increasing the width of the gate of the EMOSFET 11 or reducing its length. The timing waveform diagram of FIG. 2 will be used next to explain the operation of the input circuit of the present invention.

During a wait period, both the first and second action signals $\phi_A$ and $\phi_B$ are low and since the node 20 is also low through the EMOSFET 10, the EMOSFET 11 is cut off and power is not consumed. When the circuit enters an active period, the first action signal $\phi_A$ becomes high as shown in FIG. 2 and the charging of the MOS capacitor 13 is started. This charging time is indicated by $t_1$ in FIG. 2. When charging is completed, the second action signal $\phi_B$ is inputted (as shown by $t_2$) and the potential at the node 20 is boosted to a level higher than the source voltage $V_{CC}$. At this point, the EMOSFET 11 is completely conductive and an output signal with reversed polarity is outputted at the output terminal $\phi_{OUT}$ in response to an input signal $\phi_{IN}$ after a delay time of $t_d$.

Since the driving capability of the EMOSFET 11 is set to be sufficiently larger than that of the DMOSFET 12, the potential at the node 21 is maintained approximately at the level of the source voltage $V_{CC}$, and since the circuit composed of the EMOSFETs 2, 3 and 4 and the DMOSFET 12 is similar to a conventional input circuit, the delay characteristics also show weak dependency on the source voltage. The dependency of the delay time $t_d$ of this embodiment on the source voltage is shown by the curve 9 in FIG. 3.

In summary, an input circuit according to the present invention can reduce the power consumption during the wait period and provides favorable delay characteristics with weak dependency on the source voltage during the active period, thereby contributing significantly to the improvement of the capabilities of MOS integrated circuit elements.

What is claimed is:

1. An input circuit of MOS integrated circuit elements for a signal transmitting circuit comprising
   a first enhancement-mode MOS field-effect transistor (EMOSFET), the gate thereof being connected to a power source and the drain thereof being connected to a first action signal,
   a second EMOSFET, the drain thereof being connected to said power source, and
   a depletion-mode MOS field-effect transistor (DMOSFET), the gate and source thereof being connected to each other,
   the source of said first EMOSFET being connected to the gate of said second EMOSFET, the source of said second EMOSFET being connected to the drain of said DMOSFET, a boost capacitor being connected between the gate of said second EMOSFET and a second action signal, the source of said DMOSFET being connected to said signal transmitting circuit, and the driving capacity of said second EMOSFET being sufficiently larger than that of said DMOSFET such that potential at a node between said second EMOSFET and said DMOSFET is maintained approximately at the level of said power source.

2. The input circuit of claim 1 wherein said signal transmitting circuit includes an input terminal, an output terminal, a third EMOSFET, a fourth EMOSFET and a fifth EMOSFET, the source of said fourth EMOSFET is grounded, the drain of said fourth EMOSFET and the source of said third EMOSFET are connected together and also to the source of said fifth EMOSFET, the gates of said third EMOSFET and said fourth EMOSFET are connected to said input terminal, the drain of said third EMOSFET and the source of said DMOSFET are connected together and also to the gate of said fifth EMOSFET which is connected to said output terminal, and the drain of said fifth EMOSFET is connected to said power source.

* * * * *